(12) United States Patent
Schwab

(10) Patent No.: US 8,829,787 B2
(45) Date of Patent: Sep. 9, 2014

(54) METHOD OF MANUFACTURING AN OLED

(75) Inventor: Holger Schwab, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 1 day.

(21) Appl. No.: 13/810,261

(22) PCT Filed: Jul. 11, 2011

(86) PCT No.: PCT/IB2011/053071
§ 371 (c)(1),
(2), (4) Date: Jan. 15, 2013

(87) PCT Pub. No.: WO2012/007893
PCT Pub. Date: Jan. 19, 2012

(65) Prior Publication Data
US 2013/0119858 A1 May 16, 2013

(30) Foreign Application Priority Data

Jul. 16, 2010 (EP) .................................... 10169821

(51) Int. Cl.
*H01J 1/62* (2006.01)
*H01J 63/04* (2006.01)

(52) U.S. Cl.
USPC ........... 313/504; 313/498; 313/506; 313/512; 445/24; 445/46

(58) Field of Classification Search
USPC ........... 313/498–512; 445/23–25, 46; 438/29, 438/99; 257/40
See application file for complete search history.

(56) References Cited

U.S. PATENT DOCUMENTS

2002/0067126 A1 * 6/2002 Van Den Reek et al. ..... 313/512
(Continued)

FOREIGN PATENT DOCUMENTS

JP 2003272832 A1 9/2003

OTHER PUBLICATIONS

Johan Bosman; "Processes and Strategies for Solid State Q-Switch Laser Marking of Polymers"—Thesis, Sec. 2.5.3, p. 16, Published 2007.

*Primary Examiner* — Anh Mai
*Assistant Examiner* — Kevin Quarterman
(74) *Attorney, Agent, or Firm* — Meenakshy Chakravorty

(57) ABSTRACT

The invention describes a method of manufacturing an OLED device (10), which method comprises applying a number of conductive strips (4) onto a substrate (1); depositing an organic layer (2) onto the substrate (1) within a region bounded by the conductive strips (4); applying a sealant onto the conductive strips (4) to encapsulate the OLED device (10); and depositing a conductive protective layer (6) at least partially onto each conductive strip (4) such that a surface of a conductive strip (4) external to the sealant is protected by the conductive protective layer (6). The invention also describes an OLED device (10) comprising a number of conductive strips (4) applied onto a substrate (1); an organic layer (2) deposited on the substrate (1) within a region bounded by the conductive strips (4); a conductive protective layer (6) deposited at least partially onto the conductive strips (4); and a sealant for encapsulating the OLED device (10), which sealant is applied to the conductive strips (4) such that a surface of the conductive strips (4) external to the sealant is protected by the conductive protective layer (6).

10 Claims, 3 Drawing Sheets

(56) References Cited

U.S. PATENT DOCUMENTS

| | | |
|---|---|---|
| 2005/0008894 A1 | 1/2005 | Hiruma et al. |
| 2009/0174319 A1* | 7/2009 | Shimoji ................. 313/504 |
| 2010/0084641 A1 | 4/2010 | Van Rens et al. |
| 2010/0118243 A1 | 5/2010 | Majumdar et al. |
| 2010/0157585 A1* | 6/2010 | Diekmann et al. ............ 362/228 |
| 2010/0301743 A1* | 12/2010 | Kodama et al. ............... 313/504 |

* cited by examiner

METHOD OF MANUFACTURING AN OLED

FIELD OF THE INVENTION

The invention describes a method of manufacturing an OLED device. The invention further describes an OLED device.

BACKGROUND OF THE INVENTION

Prior art manufacturing methods for an organic light-emitting diode (OLED), for example an OLED intended for lighting purposes, usually involve a number of photolithography steps for applying the various metal layers required for the electrical connections of the device. Photolithography is very complex and expensive, so that alternative approaches are being sought. For example, a cost-efficient way of applying structured metal contact pads (anode and cathode) for current distribution on a substrate is to print a strip of metal ink onto the substrate to obtain a conductive strip with the desired dimensions. These printed strips are then annealed to improve their conductivity. Silver inks are very suitable for such printing techniques on account of their favourable thermal properties and relatively high conductivity. Anode and cathode contact pads printed using an ink can have a thickness of only 300 nm to 10 µm. However, even though the electrical properties of silver are very favourable, such thin silver layers can suffer from corrosion when exposed to humidity and oxygen, especially under the presence of an electrical bias, which is the case when a voltage is applied across the anode and cathode contact pads of an OLED device. This corrosion can ultimately interrupt the electrical connection between the power supply and the OLED device, resulting in device malfunction. Therefore, prior art manufacturing methods usually use a corrosion-resistant metal for the contact pads. Corrosion-resistant metals—for example chromium, molybdenum, gold, etc.—have the disadvantage that they are unsuited to a printing process, and must therefore be applied using the more expensive and time-consuming vacuum sputter process.

It is therefore an object of the invention to provide a more economical way of manufacturing an OLED device with a favourably long lifetime.

SUMMARY OF THE INVENTION

This object is achieved by the method according to claim 1 of manufacturing an OLED device, and by the OLED device of claim 8.

According to the invention, the method of manufacturing an OLED device comprises the steps of applying a number of conductive strips onto a substrate; depositing an organic layer onto the substrate within a region bounded by the conductive strips; applying a sealant onto the conductive strips to encapsulate the OLED device; and depositing a conductive protective layer at least partially onto each conductive strip such that a surface of a conductive strip external to the sealant is protected by the conductive protective layer. The conductive protective layer not only protects the conductive strips (i.e. the contact pads) from corrosion in the critical region external to the sealant, thus effectively isolating these regions from the harmful environment, but also acts as an electrical conductor. Here, the expression 'external to the sealant' is to be understood to mean on the outside of the sealant and exposed to the environment.

An obvious advantage of the method according to the invention is a considerable saving in manufacturing cost, since cheaper highly conductive and corrosion-prone metals can be used for the conductive strips, i.e. for the anode and cathode contact pads surrounding the organic layer. For example, a relatively cheap silver ink can be used, and can be applied in a straightforward and economical printing process. The printed contact pads are then protected with a conductive protective coating or layer of some suitable material. The conductive protective layer can be very thin, thus requiring very little material, since it need only protect the conductive strips from the atmosphere. Furthermore, the use of the conductive protective material is only required for some parts of the contact pad area and therefore only small amounts of this material are required.

According to the invention, the OLED device comprises a number of conductive strips applied onto a substrate; an organic layer deposited on the substrate within a region bounded by the conductive strips; a conductive protective layer deposited at least partially onto the conductive strips; and a sealant for encapsulating the OLED device, which sealant is applied to the conductive strips such that a surface of the conductive strips external to the sealant is protected by the additional conductive protective layer. Here, the sealant can be applied directly onto uncoated parts of the conductive strips, or onto parts of the conductive strips that have previously been coated with a conductive protective layer.

An OLED device manufactured in this way is provided with a reliable and durable protection against corrosion in the region of the anode and cathode contact pads, which would otherwise be exposed to the harmful effects of the environment. Such an OLED can therefore have a longer lifetime than a prior art OLED.

The dependent claims and the subsequent description disclose particularly advantageous embodiments and features of the invention.

The conductive strips referred to in the context of the invention may generally be the anode and cathode contact pads, which are usually applied in relatively wide bands around the perimeter of the OLED device and are connected to the positive and negative poles of a power supply. A relatively large contact pad area ensures a homogenous current flow through the organic layer and a correspondingly homogenous light output. Therefore, in the following but without restricting the invention in any way, the terms 'conductive strips' and 'contact pads' may be used interchangeably.

The sealant used in the encapsulation of the OLED can be a line of adhesive (applied along a sealing path around the organic layer and along the contact pads) and a cover lid (usually a metal or glass lid) that is pressed onto the adhesive. Alternatively, the sealant can be one or more sealing layers deposited onto the organic light-emitting layer and part of the contact pads to form a hermetic seal, protecting the organic light-emitting layer from moisture in the environment. The parts of the contact pads protected by the conductive protective layer are external to the sealant, i.e. on the outside of an adhesive/cover lid combination or on the outside of a deposited sealant layer.

The conductive protective layer is applied at least partially onto a conductive strip, whereby the conductive protective layer can coat or abut any surface or edge of the conductive strip. The conductive protective layer can be applied in any suitable process. For example the conductive protective layer could be applied by pressing a very thin sheet of a suitable metal onto the areas of the contact pads that are to be protected. However, because the sheet is preferably very thin, and the areas to be coated may be very narrow, it may be somewhat difficult to apply the protective layer precisely using this approach. Therefore, in a particularly preferred embodiment of the invention, the step of applying an isolating layer comprises transferring part of a transfer layer or a sequence of transfer layers from a carrier. For example, a carrier can be prepared with a thin layer of the transfer material, and this might be pressed onto the contact pads such that parts of the transfer layer adhere to specific parts of the contact pads. For example, the transfer material may have adhesive qualities, and pressure applied selectively to the carrier layer can act to cause the corresponding parts of the transfer layer to adhere to the contact pads.

The carrier can comprise any suitable material to which a homogenous coating of a transfer material can be applied. For example, a carrier layer can comprise a sheet of glass, which has the advantage of reusability. However, to facilitate the transferral of the transfer material from the carrier layer onto the contact pads, the carrier is preferably made of a flexible material. Therefore, in a preferred embodiment of the invention, the carrier comprises a plastic foil such as polyethylene. A transfer layer can easily be printed to coat the foil, and the coated foil can be conveniently supplied in the form of a roll.

Releasing the transfer material from the carrier layer using pressure may be less precise than desired. Therefore, in a particularly preferred embodiment of the invention, the step of depositing a conductive protective layer onto a contact pad comprises performing laser mass transfer (LMT) to transfer part of the transfer layer from the carrier onto the conductive strip. For such an LMT procedure, the carrier foil can be coated with a very thin coating of basically any metal or even combinations of different metals, allowing an optimal match between the metal used for the anode/cathode and the material used for the power connection. For example, the transfer material can favourably comprise a metal such as chromium, molybdenum, gold, etc. In the known LMT techniques, the item to be coated is placed underneath the transfer layer, and the carrier layer faces upwards. Laser energy causes selected parts of the transfer layer to melt and to drop downwards onto the part to be coated, in this case a contact pad. If the carrier layer comprises a sheet of glass, a laser beam can be directed at a point in the glass to heat the glass and melt the underlying metal, so that a droplet of molten metal can then fall or be forcefully ejected away from the carrier onto the contact pad.

However, in a preferred embodiment of the invention, the step of performing laser mass transfer comprises depositing energy at a specific location in the transfer layer to cause the transfer layer to be at least partially transferred onto the conductive strip. The energy deposition causes a local build-up of pressure to 'eject' the transfer layer from the carrier and onto the conductive strip. In this way, the amount or shape of transfer material that is transferred onto the conductive strip can be controlled very precisely. This has the advantage that the amount of metal deposited onto the contact pads can be kept to a minimum, making the procedure quite economical, even if expensive metal such as gold or molybdenum is used as the transfer metal.

When a small region of the transfer metal is heated by the laser energy, it melts, and may also vaporise at the interface between the metal and the carrier foil (which does not melt), causing a local build-up of pressure. This can result in a molten metal droplet being forcefully ejected outward from the carrier, and may 'splatter' onto the item to be coated. In the case of a partially completed OLED, a TCO layer or an organic layer within the sealing path should be kept free of any such splatters, since these may detract from the visual appearance of the finished product. Therefore, in a further preferred embodiment of the invention, the carrier and transfer layers are positioned such that the transfer layer is in direct contact with the region bounded by the sealing path. Then, sections of the transfer material can be selectively transferred in an LMT process onto corresponding regions of the contact pads, while the transfer metal, ejected from the carrier layer with some force, is prevented from splattering the organic surface. For example, only outer regions of the contact pad can be coated. An adhesive can then be applied along the border of the transfer metal, so that, once the cover lid is in place, only those surfaces of the contact pads that lie outside the sealant are covered by the transfer metal.

Of course, the application of a conductive protective layer can be carried out for a finished OLED device in order to prolong its active life. However, the step of depositing the conductive protective layer onto the contact pads preferably precedes the step of encapsulating the OLED device, particularly if the sealant comprises a cover lid pressed onto a line of adhesive, since the transfer metal can be optimally transferred onto the contact pad if the carrier and transfer layers are in close contact with the contact pads and the organic layer, for the reasons given above.

The transfer metal applied to the contact pads is not limited to a single layer of a one kind of metal. In a preferred embodiment of the invention, the conductive protective layer comprises a layer of at least one essentially non-corrosive metal such as molybdenum, chromium, gold, etc. For example, it may be desired to have layers of different metals to coat the contact pads. A first layer can be applied in a first LMT step, and a second layer can subsequently be applied in a second LMT step. Preferably, in a more efficient approach, the carrier foil can be coated in advance with two or more layers of different metals or a mixture of metals, and these can be applied in a single LMT step.

A thin metal transfer layer is easier to transfer in an LMT process than a thick layer, since small metal droplets will form more readily. Furthermore, a conductive protective layer can be very thin, since the corrosion protection presented by a thin, uniform layer of the materials mentioned above is just as effective as that of a thicker layer. Therefore, the conductive protective layer preferably has a thickness of at most 1.0 μm, more preferably at most 0.3 μm, and most preferably at most 100 nm.

The contact pads of a typical OLED can be 300 μm to 30 mm in width. If the conductive protective layer is to be applied only the regions that will be exposed after encapsulation, the width of the conductive protective layer can be as little as 100 μm to 3 mm. If an LMT process is used, the laser is preferably controlled precisely in order to obtain the desired transfer width. In a preferred embodiment of the invention, a conductive protective layer essentially completely covers a conductive strip. For example, the contact pads can be completely coated with a transfer metal layer. This may be the simplest and most cost-effective approach. Even if the transfer metal is a relatively poor conductor, it will not detract from the conductivity of the contact pads. However, if the transfer metal is a good conductor, the conductive protective layer then not only serves to protect the regions of the contact pads which would otherwise be exposed to the environment, but has the additional advantage of also contributing to the overall conductivity of the contact pads.

In another embodiment of the invention, the conductive protective layer is applied not to coat a contact pad, but is applied directly adjacent to the contact pad so that the conductive protective layer abuts onto an edge of the adjacent contact pad. In this way, an electrical contact is established between the conductive protective layer and the contact pad. In this case, the substrate can be pre-treated with a conductive protective layer pattern. For example, an LMT process can be carried out to apply a 'border' of transfer metal—for example a corrosion-resistant metal with good conductivity—to the outer regions of the substrate corresponding to an outer anode region and an outer cathode region. In a following step, the remainder of the anode and cathode contact pads can be printed using a suitable metal such as a silver ink to lie within the transfer metal regions and adjacent to (or abutting) these. Alternatively, the silver ink can be printed first—in narrower bands than would otherwise be printed—and a conductive protective layer of transfer metal can then be deposited in an LMT process at the outer edges of the printed regions. Once the organic layer is in place, the sealant is applied at the boundary between the conductive protective layer and the contact pads, to encapsulate the OLED. For example, this boundary can be the sealing path for an adhesive line, which is applied along this boundary before subsequently putting a cover lid in place. Alternatively, layers of sealant can be deposited onto the organic light-emitting layer, up to the boundary. In such an embodiment, a good conductor is preferably used as the transfer metal, for example gold or molybdenum. Even though these metals are expensive, the very thin layers that can be achieved in the LMT process can still make such OLEDs economical to realise.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the diagrams, like numbers refer to like objects throughout. Elements of the diagrams are not necessarily drawn to scale, particularly the OLED device layer thicknesses and the thicknesses of the contact pads and conductive protective layers.

DETAILED DESCRIPTION OF THE EMBODIMENTS

Figure 1:
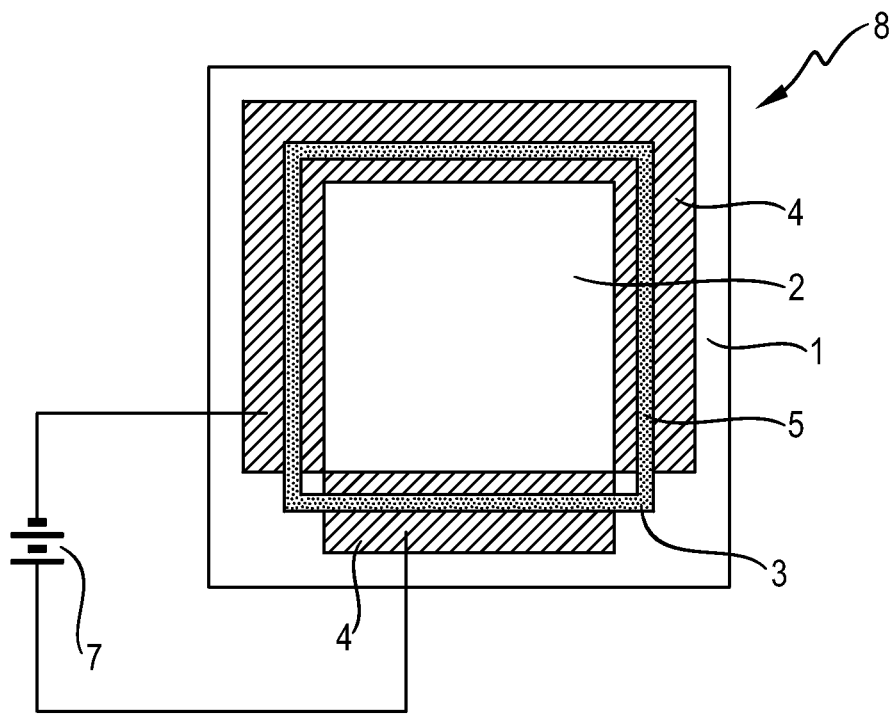
FIG. 1 shows a plan view of a prior art OLED device.

FIG. 1 shows a plan view of a prior art OLED device 8. Contact pads 4 for an anode and cathode are applied—for example as printed metal lines—around the perimeter of a substrate 1. The anode and cathode contact pads can cover the same area, or one of the contact pads can cover more area than the other, as shown here, depending on the realisation of the OLED. A line of adhesive 5 is used to attach a cover lid 3 to protect an organic layer 2 from any moisture. The contact pads 4 are partly within the adhesive 5 and partly outside. The parts of the contact pads 4 within the adhesive line 5 are protected from moisture and oxygen and are therefore not affected by corrosion. The parts of the contact pads 4 outside the encapsulation, i.e. outside or external to the adhesive line 5, are exposed to the environment and are therefore liable to suffer from corrosion, which can occur when the positive and negative poles of a power supply 7 are connected to the anode and cathode contact pads 4.

Figure 2:
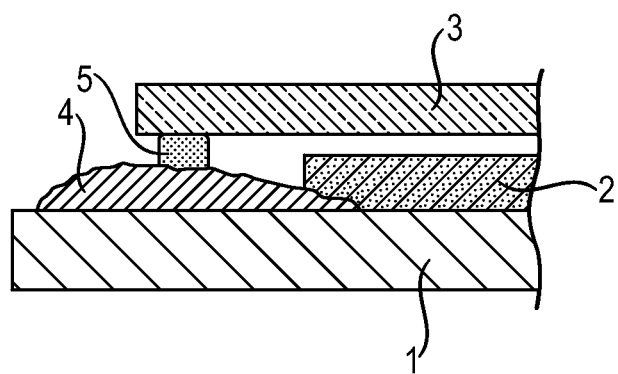
FIG. 2 shows a cross-section of the prior art OLED device of FIG. 1.

FIG. 2 shows a cross-section of the prior art OLED device of FIG. 1, showing in more detail a contact pad 4 applied to a substrate 1, the organic layer 2, an adhesive 5, and the cover lid 3. Anything within the adhesive 5 is protected from the environment, while anything outside the adhesive 5 is exposed the corrosive effects of the atmosphere.

Figure 3:
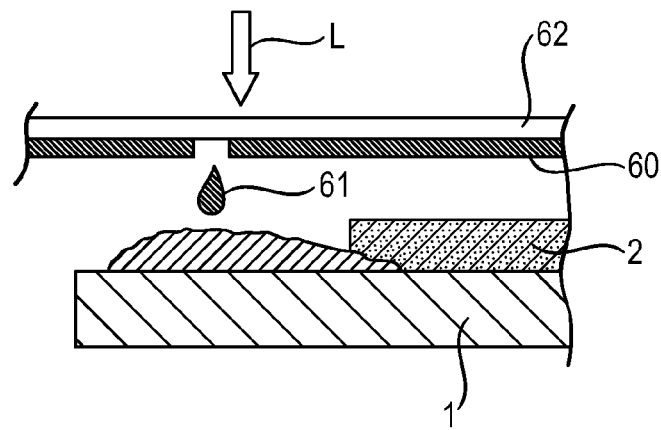
FIG. 3 illustrates the application of a conductive protective layer to a contact pad using the method according to the invention.

FIG. 3 illustrates the application of a conductive protective layer to a contact pad using the method according to the invention. The contact pad 4 can have been applied by printing a band or strip of silver ink, and may have a width of about 0.5 μm-20 μm. Here, an organic layer 2 has been applied to partially cover the contact pad 4. A polyethylene carrier foil 62 is positioned above the contact pad 4 such that a transfer layer 60—for example a thin coating of chromium or molybdenum—is facing towards the contact pad 4 and the organic light-emitting layer 2. In fact, the carrier foil is preferably positioned so that the transfer layer 60 is in direct contact with the organic layer 2, but for the sake of clarity, they are shown at a distance from each other in this diagram. The transfer layer 60 can have a coating thickness of only a few micrometers. A pulsed laser system, for example a nanosecond UV laser is controlled so that a beam of laser light L is directed through the carrier foil 62 so that it locally heats the metal of the transfer layer 60 at a specific location above the contact pad 4. At this point at the interface between the carrier foil 62 and the transfer layer 60, the metal vapourises, a local pressure builds up between the carrier foil 62 and the molten metal. Due to the expansion of gas, a metal droplet 61 is accelerated and ejected towards to land on the contact pad 4 beneath. When the metal droplet 61 hits the contact pad 4 it adheres to its surface. This process is repeated to obtain a metal line from a series of individual metal droplets for the desired coverage of the contact pad 4. Typical layer thicknesses are in the order of a few micrometers down to some hundred nanometers. The achievable conductivities are typically greater by a factor of seven than the bulk resistivity of the bulk material used.

Figure 4:
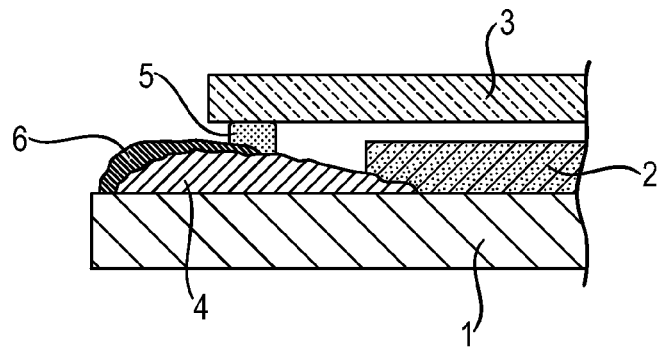
FIG. 4 shows a cross-section of an OLED device obtained using the method according to a first embodiment of the invention.

FIG. 4 shows a cross-section of an outer region of an OLED device obtained using the method according to a first embodiment of the invention, in which the conductive protective layer 6 is applied on the outer region of the contact pad 4. To encapsulate the OLED, an adhesive 5 is applied along the border between the conductive protective layer 6 and the exposed contact pad 4. Of course, the adhesive 5 could be applied to lie just inside the edge of the conductive protective layer 6, without touching the contact pad surface. The cover lid 3 is then put into place and the exposed contact pad 4, i.e. the surface not covered by the conductive protective layer 6, is effectively protected from the corrosive effects of the atmosphere.

Figure 5:
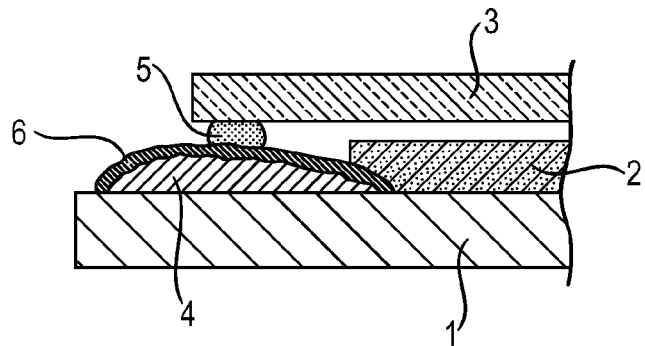
FIG. 5 shows a cross-section of an OLED device obtained using the method according to a second embodiment of the invention.

FIG. 5 shows a cross-section of an outer region of an OLED device obtained using the method according to a second embodiment of the invention, in which the conductive protective layer 6 is applied to cover the entire contact pad 4, and the adhesive is applied onto the conductive protective layer 6.

Figure 6:
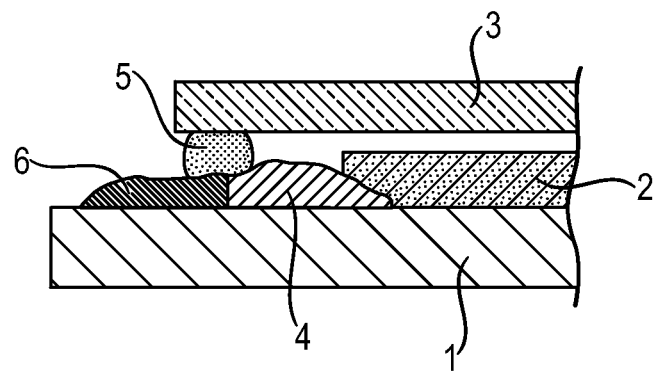
FIG. 6 shows a cross-section of an OLED device obtained using the method according to a third embodiment of the invention.

FIG. 6 shows a cross-section of an outer region of an OLED device obtained using the method according to a third embodiment of the invention, in which the contact pad 4 is narrower than in the realisations described above. Here, the conductive protective layer 6 is applied adjacent to the narrow contact pad 4, and the adhesive 5 is applied along the border between the conductive protective layer 6 and the contact pad 4.

The contact pads can be isolated using any combination of the techniques described above. For example, the realisation of FIG. 4 could be used for the larger contact pad (often the cathode), while the shorter contact pad could be realised as shown in FIG. 6. The realisation shown in FIG. 5 might be preferred on account of its straightforwardness. The realisation of FIG. 4 might be preferred since it combines a low material consumption with an optimal isolation from the harmful effects of the environment and in no way detracts from the conductivity of the contact pads.

Figure 7:
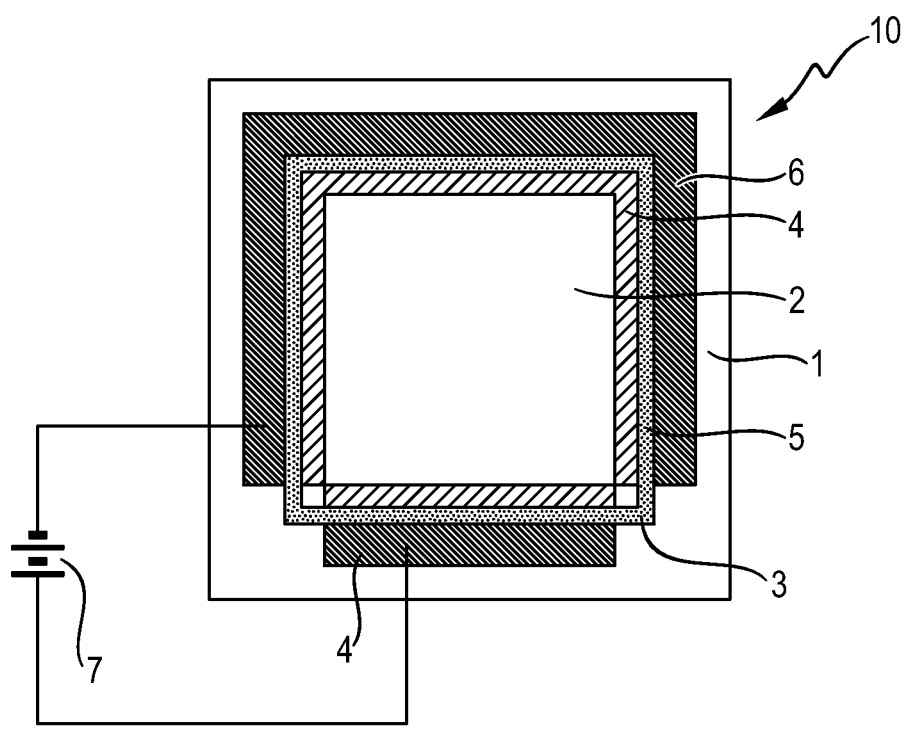
FIG. 7 shows a plan view of an OLED device manufactured using the method according to the invention.

FIG. 7 shows a plan view of an OLED device 10 manufactured using the method according to the invention described in FIG. 4 or FIG. 6 above. Contact pads 4 for an anode and cathode are applied—for example as printed metal lines—around the perimeter of a substrate 1. A thin conductive protective layer 6 is applied in an LMT process to coat the parts of the contact pads 4 that would lie outside an adhesive line 5, or to lie adjacent to narrower contact pads 4. A cover lid 3 is placed on top of the adhesive line 5, which together act as a sealant to encapsulate the OLED 10 and protect the organic layer 2. The contact pads 4 are protected from corrosion by the conductive protective layer 6.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art from a study of the drawings, the disclosure, and the appended claims. For the sake of clarity, it is to be understood that the use of "a" or "an" throughout this application does not exclude a plurality, and "comprising" does not exclude other steps or elements. The mere fact that certain measures are recited in mutually different dependent claims does not indicate that a combination of these measures cannot be used to advantage. Any reference signs in the claims should not be construed as limiting the scope.

The invention claimed is:

1. A method of manufacturing an OLED device comprising:
    applying a number of conductive strips onto a substrate;
    depositing an organic layer onto the substrate within a region bounded by the conductive strips;
    applying a sealant onto the conductive strips to encapsulate the OLED device; and
    depositing a conductive protective layer at least partially onto each conductive strip such that a surface of a conductive strip external to the sealant is protected by the conductive protective layer, wherein the step of depositing a conductive protective layer comprises transferring part of a transfer layer or a sequence of transfer layers from a carrier.

2. A method according to claim 1, wherein the carrier comprises a plastic foil.

3. A method according to claim 1, wherein the step of depositing a conductive protective layer onto each conductive strip comprises performing laser mass transfer to transfer the part of the transfer layer from the carrier onto the conductive strip.

4. A method according to claim 3, wherein the step of performing laser mass transfer comprises depositing energy at a specific location in the transfer layer to cause the transfer layer to be at least partially transferred onto the conductive strip.

5. A method according to claim 2, wherein the carrier is positioned with respect to the organic layer such that the transfer layer is in direct contact with the organic layer.

6. A method according to claim 2, wherein the step of depositing a conductive protective layer onto each conductive strip precedes the step of applying a sealant onto the conductive strips.

7. An OLED device, comprising:
    a number of conductive strips applied onto a substrate;
    an organic layer deposited on the substrate within a region bounded by the conductive strips;
    a conductive protective layer applied to abut at least one given conductive strip of the conductive strips at a lateral surface of said given conductive strip such that an electrical contact is established between the conductive protective layer and the given conductive strip; and
    a sealant for encapsulating the OLED device, wherein said sealant is applied above said given conductive strip and is applied at a boundary between the conductive protective layer and the given conductive strip such that said lateral surface of the given conductive strip is protected by the conductive protective layer.

8. An OLED device according to claim 7, wherein the conductive protective layer comprises a layer of at least one corrosion-resistant metal.

9. An OLED device according to claim 7, wherein the conductive protective layer has a thickness of at most 1.0 μm.

10. An OLED device according to claim 9, wherein the conductive protective layer has a thickness of less than about 100 nm.

* * * * *